(12) United States Patent
Kamo

(10) Patent No.: US 8,778,748 B2
(45) Date of Patent: Jul. 15, 2014

(54) METHOD FOR MANUFACTURING SEMICONDUCTOR DEVICE

(75) Inventor: Yoshitaka Kamo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 250 days.

(21) Appl. No.: 13/355,991

(22) Filed: Jan. 23, 2012

(65) Prior Publication Data

US 2012/0315708 A1    Dec. 13, 2012

(30) Foreign Application Priority Data

Jun. 13, 2011    (JP) ................. 2011-131206

(51) Int. Cl.
  *H01L 21/338*   (2006.01)
  *H01L 23/544*   (2006.01)
  *H01L 21/04*    (2006.01)
  *H01L 29/66*    (2006.01)

(52) U.S. Cl.
  CPC ........... *H01L 23/544* (2013.01); *H01L 21/0475* (2013.01); *H01L 29/66848* (2013.01)
  USPC ............... 438/176; 438/401; 257/E21.623; 257/E23.179

(58) Field of Classification Search
  CPC ............... H01L 29/66848; H01L 21/02697; H01L 21/0475; H01L 23/544; H01L 29/42316; H01L 29/66462
  USPC .......... 438/167, 176, 283, 401; 257/E21.623, 257/E23.179
  See application file for complete search history.

(56) References Cited

U.S. PATENT DOCUMENTS

| 5,686,737 | A  | * | 11/1997 | Allen ............................. 257/77 |
| 5,970,328 | A  | * | 10/1999 | Park et al. .................... 438/176 |
| 6,864,156 | B1 | * | 3/2005  | Conn ............................ 438/459 |
| 7,518,169 | B2 | * | 4/2009  | Taddiken ..................... 257/288 |
| 8,008,667 | B2 |   | 8/2011  | Koyama et al. |
| 8,304,271 | B2 | * | 11/2012 | Huang et al. .................. 438/48 |
| 2003/0211707 | A1 | * | 11/2003 | Brouillette et al. ......... 438/459 |
| 2006/0035159 | A1 | * | 2/2006  | Best et al. ..................... 430/22 |
| 2006/0081936 | A1 | * | 4/2006  | Kim et al. .................... 257/365 |
| 2006/0121658 | A1 | * | 6/2006  | Ahn et al. .................... 438/167 |
| 2006/0289901 | A1 | * | 12/2006 | Sheppard et al. ............ 257/256 |
| 2007/0117343 | A1 | * | 5/2007  | Hwang et al. ................ 438/401 |

(Continued)

FOREIGN PATENT DOCUMENTS

| JP | 9-82940 A       |   | 3/1997 |             |
| JP | 11214407 A      | * | 8/1999 | ........... H01L 21/338 |
| JP | 2006-93684 A    |   | 4/2006 |             |
| JP | 2007-73815 A    |   | 3/2007 |             |

*Primary Examiner* — William F Kraig
*Assistant Examiner* — Joseph C Nicely
(74) *Attorney, Agent, or Firm* — Leydig, Voit & Mayer, Ltd.

(57) ABSTRACT

A method for manufacturing a semiconductor device includes forming a source electrode and a drain electrode on a front face of a semiconductor substrate which is transparent to visible light, forming a front-side gate electrode between the source electrode and the drain electrode on the front face of the semiconductor substrate; forming an aligning mark on a region of the front face of the semiconductor substrate other than a region between the source electrode and the drain electrode, aligning the semiconductor substrate based on the aligning mark that is seen through the semiconductor substrate, and forming a back-side gate electrode on a back face of the semiconductor substrate in a location opposite the front-side gate electrode.

7 Claims, 4 Drawing Sheets

(56) References Cited

U.S. PATENT DOCUMENTS

| | | | |
|---|---|---|---|
| 2008/0054313 A1* | 3/2008 | Dyer et al. | 257/276 |
| 2008/0315435 A1* | 12/2008 | Wark | 257/777 |
| 2010/0237451 A1* | 9/2010 | Murakoshi | 257/432 |
| 2010/0301358 A1* | 12/2010 | Shibata et al. | 257/98 |
| 2011/0003449 A1* | 1/2011 | Herrick et al. | 438/270 |
| 2011/0068326 A1* | 3/2011 | Jang et al. | 257/30 |
| 2011/0114968 A1* | 5/2011 | Sheppard et al. | 257/77 |
| 2011/0159631 A1* | 6/2011 | Fu et al. | 438/70 |
| 2012/0091471 A1* | 4/2012 | Ellison et al. | 257/77 |
| 2012/0132967 A1* | 5/2012 | Andry et al. | 257/288 |
| 2012/0193741 A1* | 8/2012 | Borthakur et al. | 257/433 |
| 2012/0202320 A1* | 8/2012 | Feng et al. | 438/113 |
| 2013/0069190 A1* | 3/2013 | Kao et al. | 257/432 |
| 2013/0277735 A1* | 10/2013 | Kinzer et al. | 257/330 |

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device having a back-side gate electrode on the location facing the front-side gate electrode on the back face of the substrate.

2. Background Art

A transistor having a plurality of gate electrodes between a source electrode and a drain electrode in order to improve OFF characteristics has been proposed (for example, refer to Japanese Patent Laid-Open No. 2007-73815). For increasing the yield, it is necessary to ensure that the distance between the gate electrodes is a certain distance or more. Therefore, since the distance between the source electrode and the drain electrode is greater, the ON resistance is increased, voltage lowering occurs, output is lost, and the ON characteristics of the element are degraded. Thus, the ON characteristics and the OFF characteristics have been in a tradeoff relationship.

On the other hand, a transistor having a back-side gate electrode on the location facing the front-side gate electrode on the back face of the substrate has been proposed (for example, refer to Japanese Patent Laid-Open No. 9-82940). Thereby, the ON-OFF control of current can be performed from both the front side and the back-side, and the OFF characteristics are improved. In addition, since the distance between the source electrode and the drain electrode is not increased, the degrading of the ON characteristics can also be prevented.

SUMMARY OF THE INVENTION

In general, when the patterns of the front side and the back-side are aligned, a double-sided aligner for observing the front side and the back side of a substrate simultaneously using a microscope is used. However, since the aligning accuracy of the double-sided aligner is several to the several tens of microns, the double-sided aligner cannot be applied to the fabrication of transistors requiring alignment of sub-micron scale or smaller.

In Japanese Patent Application Laid-Open No. 9-82940, when the back-side gate electrode is formed, the resist applied to the back face is exposed from the front face using the front-side gate electrode as a mask. Therefore, when the front-side gate electrode is T-shaped, the gate length of the back-side gate electrode becomes longer than the gate length of the front-side gate electrode. In addition, since light for exposure is transmitted, the channel thickness is limited. Furthermore, in actual semiconductor devices, since protective films or plated wirings are formed on the front-side gate electrode, exposure from the front face is difficult.

In view of the above-described problems, an object of the present invention is to easily fabricate the semiconductor device having high ON characteristics and high OFF characteristics without impairing the freedom of design.

According to the present invention, a method for manufacturing a semiconductor device includes: forming a source electrode and a drain electrode on a front face of a semiconductor substrate which is transparent to visible light; forming a front-side gate electrode between the source electrode and the drain electrode on the front face of the semiconductor substrate; forming an aligning mark on a region of the front face of the semiconductor substrate other than a region between the source electrode and the drain electrode; and aligning the semiconductor substrate based on the aligning mark that is seen through the semiconductor substrate and forming a back-side gate electrode on a back face of the semiconductor substrate in a location opposite the front-side gate electrode.

The present invention makes it possible to easily fabricate the semiconductor device having high ON characteristics and high OFF characteristics without impairing the freedom of design.

Other and further objects, features and advantages of the invention will appear more fully from the following description.

DETAILED DESCRIPTION OF THE PREFERRED EMBODIMENTS

A method for manufacturing a semiconductor device according to the embodiments of the present invention will be described with reference to the drawings. The same components will be denoted by the same symbols, and the repeated description thereof may be omitted.

First Embodiment

Figure 1:
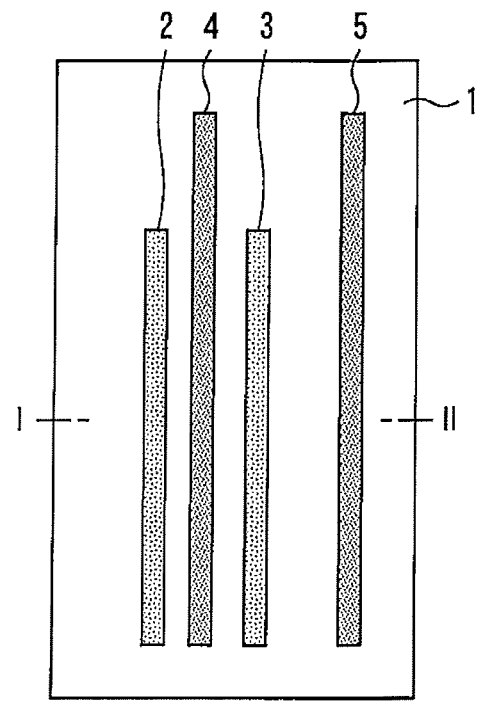
FIG. 1 is a top view showing a semiconductor device according to a first embodiment of the present invention.
Figure 2:
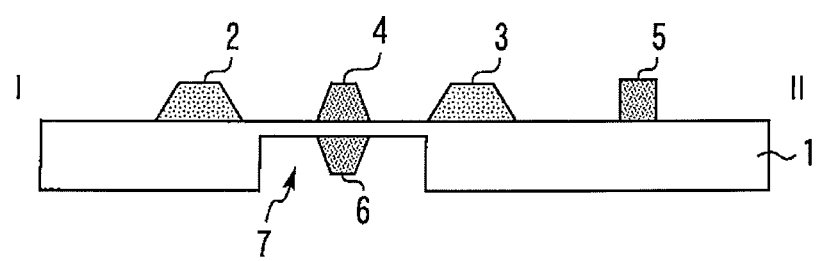
FIG. 2 is a sectional view taken along line I-II in FIG. 1.

FIG. 1 is a top view showing a semiconductor device according to a first embodiment of the present invention. FIG. 2 is a sectional view taken along line I-II in FIG. 1. The semiconductor substrate 1 is transparent to visible light, and is formed of a wide-gap semiconductor, such as SiC and GaN.

A source electrode 2 and a drain electrode 3 are formed on the front face of the semiconductor substrate 1, and the front-side gate electrode 4 is formed in between. An aligning mark 5 is formed on the region of the front face of the semiconductor substrate 1 other than the region between the source electrode 2 and the drain electrode 3. A back-side gate electrode 6 is formed on the back face of the semiconductor substrate 1 opposite the front-side gate electrode 4. The back-side gate electrode 6 is placed in a recess 7 formed on the back face of the semiconductor substrate 1.

The source electrode 2 and the drain electrode 3 are formed of, for example, Au. The front-side gate electrode 4, the aligning mark 5, and the back-side gate electrode 6 are formed of, for example, Pt/Au. The front-side gate electrode 4 and the back-side gate electrode 6 are mutually Schottky-bonded to the front face and the back face of the semiconductor substrate 1. By supplying a gate voltage to the front-side gate electrode gate electrode 4 and the back-side gate electrode 6, the ON-OFF of the current flowing between the source electrode 2 and the drain electrode 3 is controlled.

Next, a method for fabricating the semiconductor device according to the present embodiment will be described. FIGS. 3 to 10 are sectional views showing the method for fabricating the semiconductor device according to the first embodiment of the present invention.

Figure 3:
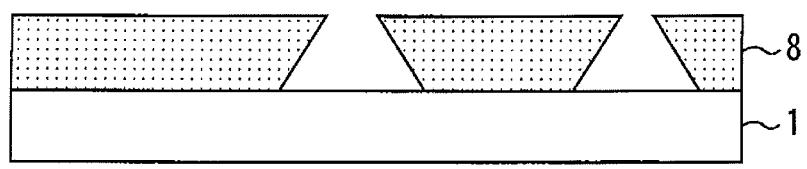
FIGS. 3 to 10 are sectional views showing the method for fabricating the semiconductor device according to the first embodiment of the present invention.

Firstly, as shown in FIG. 3, a photo-resist 8 is applied to the front face of the semiconductor substrate 1. By exposing and developing, the patterns for the source electrode 2 and the drain electrode 3 are formed on the photo-resist 8.

Figure 4:
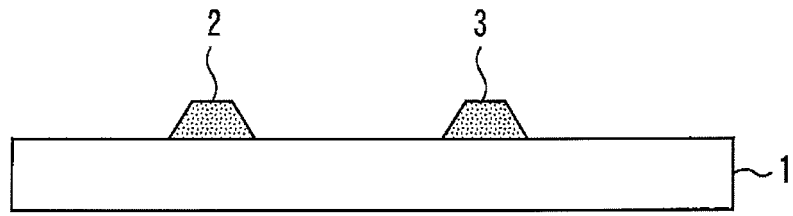

Next, as shown in FIG. 4, the source electrode 2 and the drain electrode 3 are formed on the front face of the semiconductor substrate 1 by vapor deposition lift off. Thereafter, the photo-resist 8 is removed.

Figure 5:
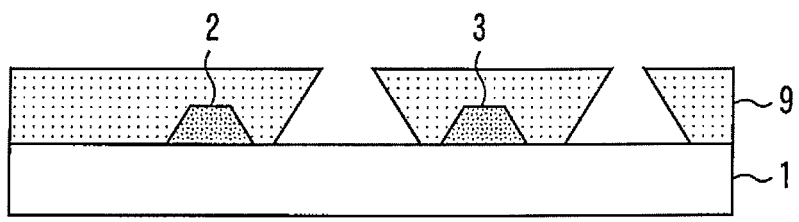

Next, as shown in FIG. 5, a photo-resist 9 is applied to the front face of the semiconductor substrate 1. By exposure and development, the patterns for the front-side gate electrode 4 and the aligning mark 5 are formed on the photo-resist 9.

Figure 6:
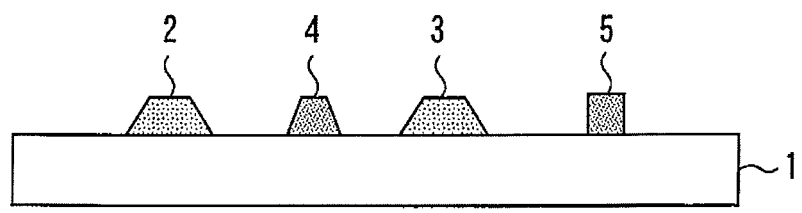

Next, as shown in FIG. 6, the front-side gate electrode 4 and the aligning mark 5 are simultaneously formed on the front face of the semiconductor substrate 1 by vapor deposition lift off. However, the front-side gate electrode 4 is formed between the source electrode 2 and the drain electrode 3, and the aligning mark 5 is formed in a region other than the region between the source electrode 2 and the drain electrode 3. Thereafter, the photo-resist 9 is removed.

Figure 7:
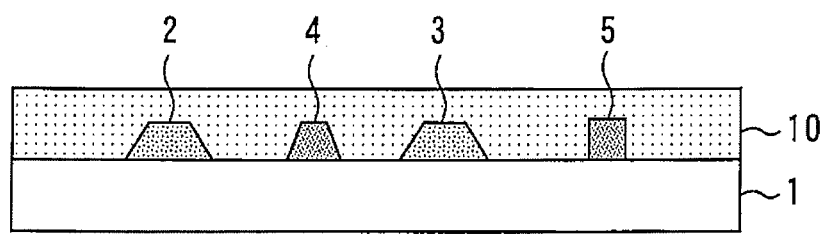
Figure 8:
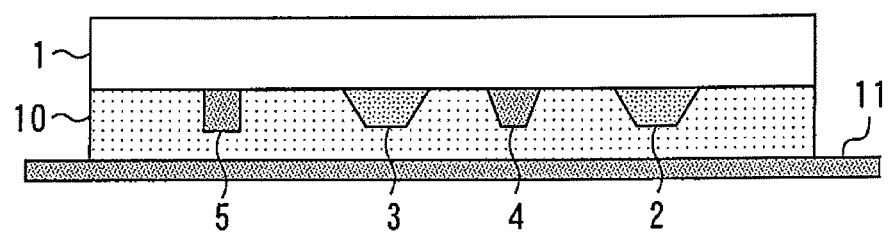

Next, as shown in FIG. 7, a photo-resist 10 for protection is applied on the front face of the semiconductor substrate 1. Then, as shown in FIG. 8, the semiconductor substrate 1 is adhered to the supporting substrate 11 such as a glass substrate with the back face of the semiconductor substrate 1 facing up.

Figure 9:
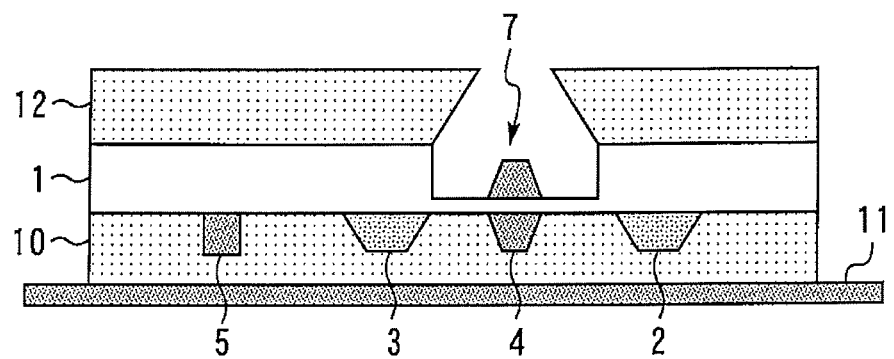

Next, as shown in FIG. 9, based on the aligning mark 5 that can be seen through the semiconductor substrate 1, the semiconductor substrate 1 is aligned with a normal stepper (reduced projection type exposure apparatus). A photo-resist 12 is applied to the back face of the semiconductor substrate 1. By exposure and development, the pattern for the back-side gate electrode 6 is formed on the photo-resist 12. Using this pattern, the recess 7 is formed on the back face of the semiconductor substrate 1.

Figure 10:
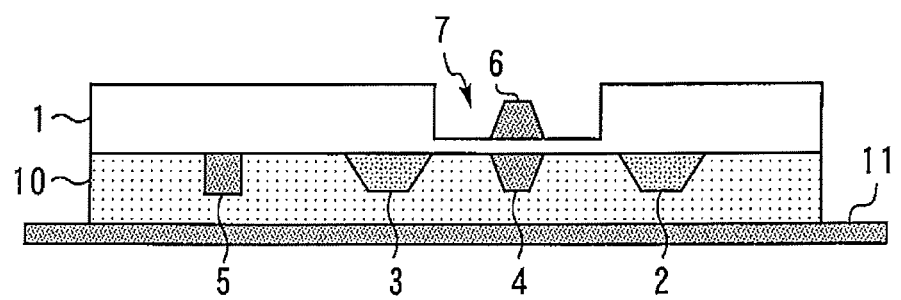

Next, as shown in FIG. 10, the back-side gate electrode 6 is formed by vapor deposition lift-off on the back face of the semiconductor substrate 1 in the location opposite the front-side gate electrode 4. Thereafter, the photo-resist 12 is removed. The semiconductor device is peeled from the supporting substrate 11, and the photo-resist 10 is removed. Through the above-described processes, the semiconductor device according to the present embodiment is fabricated.

Subsequently, the effect of the present embodiment will be described. Since the back-side gate electrode 6 is formed on the back face of the semiconductor substrate 1 in the location opposite the front-side gate electrode 4, the ON-OFF control of currents can be performed from both the front side and the back-side, and the OFF characteristics are improved.

In addition, since the aligning mark 5 is formed in a region other than the region between the source electrode 2 and the drain electrode 3, the distance between the source electrode 2 and the drain electrode 3 is not increased. Therefore, degrading of the ON characteristics can be prevented.

In addition, since aligning is performed based on the aligning mark 5 that can be seen through the semiconductor substrate 1, the back-side gate electrode 6 can be accurately aligned to the front-side gate electrode 4.

Conventionally, although the resist applied to the back face had to be exposed from the front face, in the present embodiment, it is only required that the aligning mark 5 can be seen through the semiconductor substrate 1. Therefore, the limitation of the channel thickness is less compared with conventional methods.

Furthermore, in the present embodiment, since exposure is performed from the back face when the back-side gate electrode 6 is formed, the fabrication is easier than conventional methods wherein exposure is performed through the front face.

Therefore, by the method for semiconductor device fabrication according to the present embodiment, the semiconductor device having high ON characteristics and high OFF characteristics can be easily fabricated without impairing the freedom of design.

Moreover, since the front-side gate electrode 4 and the aligning mark 5 are simultaneously formed, no addition of a new fabrication process for forming the aligning mark 5 is required.

Second Embodiment

Figure 11:
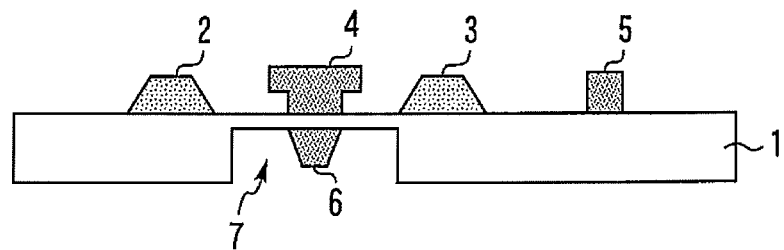
FIG. 11 is a sectional view showing a semiconductor device according to a second embodiment of the present invention.

FIG. 11 is a sectional view showing a semiconductor device according to a second embodiment of the present invention. In the present embodiment, the front-side gate electrode 4 is T-shaped. The gate length of the front-side gate electrode 4 is identical to the gate length of the back-side gate electrode 6. Other components and methods for fabrication are identical to those in the first embodiment.

When the front-side gate electrode 4 is T-shaped, according to conventional methods wherein the resist applied to the back face is exposed from the front face using the front-side gate electrode 4 as the mask, the gate length of the back-side gate electrode 6 becomes longer than the gate length of the front-side gate electrode 4. On the other hand, in the present embodiment, since exposure is performed through the back face when the back-side gate electrode 6 is formed, the gate length of the front-side gate electrode 4 can be identical to the gate length of the back-side gate electrode 6.

Third Embodiment

Figure 12:
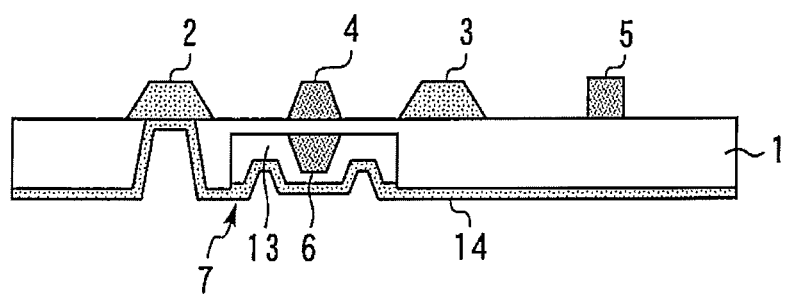
FIG. 12 is a sectional view showing a semiconductor device according to a third embodiment of the present invention.

FIG. 12 is a sectional view showing a semiconductor device according to a third embodiment of the present invention. In the present embodiment, an insulator 13 is filled in the recess 7 to coat the back-side gate electrode 6 with the insulator 13. The insulator 13 is formed of, for example, SiN. Thereafter, a metal 14 for die bonding electrically connected to the source electrode 2 on the back face of the semiconductor substrate 1 is formed. Other components and fabricating methods are identical to those in the first embodiment. By thus coating the back-side gate electrode 6 with the insulator 13, short-circuiting between the back-side gate electrode 6 and the source electrode 2 can be prevented.

Fourth Embodiment

Figure 13:
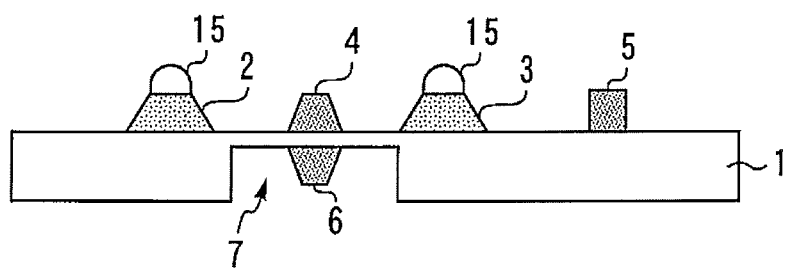
FIGS. 13 and 14 are sectional views showing a method for fabricating the semiconductor device according to the fourth embodiment of the present invention.
Figure 14:
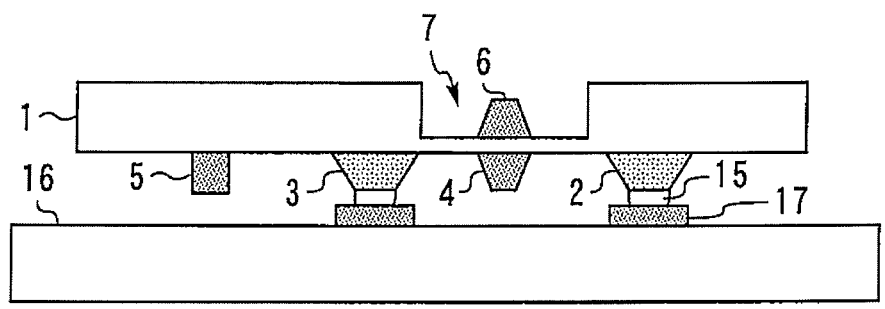

FIGS. 13 and 14 are sectional views showing a method for fabricating the semiconductor device according to the fourth embodiment of the present invention. Firstly, as shown in FIG. 13, solder bumps 15 are formed on the source electrode 2 and the drain electrode 3. Then, as shown in FIG. 14, the front face of the semiconductor substrate 1 is pointed to the circuit board 16, and the source electrode 2 and the drain electrode 3 are bonded to the electrodes 17 of the circuit board 16 through the solder bumps 15. In other words, the semiconductor device is mounted to the circuit board 16 facing down. Thereby, the physical breakdown of the back-side gate electrode 6 on the back face of the semiconductor substrate 1 by contacting with the circuit board 16 can be prevented.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-131206, filed on Jun. 13, 2011 including specification, claims, drawings and summary, on which the Convention priority of the present application is based, are incorporated herein by reference in its entirety.

What is claimed is:

1. A method for manufacturing a semiconductor device comprising:
   forming a source electrode and a drain electrode on a front face of a semiconductor substrate which is transparent to visible light and which has opposed front and back faces;
   forming a front-side gate electrode between the source electrode and the drain electrode on the front face of the semiconductor substrate;
   forming an aligning mark on the front face of the semiconductor substrate at a location other than between the source electrode and the drain electrode;
   from the back face of the semiconductor substrate, aligning the semiconductor substrate with respect to the source, front-side gate, and drain electrodes, using the aligning mark by observing the alignment mark through the semiconductor substrate; and
   forming a back-side gate electrode on the back face of the semiconductor substrate at a location directly opposite the front-side gate electrode, based on the aligning of the semiconductor substrate with respect to the source, front-side gate, and drain electrodes, using the aligning mark.

2. The method for manufacturing a semiconductor device according to claim 1, including forming the front-side gate electrode and the aligning mark simultaneously and of the same material on the front face of the semiconductor substrate.

3. The method for manufacturing a semiconductor device according to claim 1, wherein the front-side gate electrode is T-shaped, and gate length of the front-side gate electrode is equal to gate length of the back-side gate electrode.

4. The method for manufacturing a semiconductor device according to claim 1, further comprising:
   after aligning the semiconductor substrate at the back face, and before forming the back-side electrode, forming a recess in the semiconductor substrate, from the back face of the semiconductor substrate, and located opposite the front-side gate electrode; and
   forming the back-side gate electrode in the recess directly opposite the front-side gate electrode.

5. The method for manufacturing a semiconductor device according to claim 4, further comprising:
   filling the recess with an electrically insulator material, covering the back-side gate electrode;
   penetrating the semiconductor substrate at the back face, opposite the source electrode and exposing the source electrode; and
   forming a metal on the back face of the semiconductor substrate, after filling the recess and exposing the source electrode so that the metal is electrically insulated from the back-side gate electrode and electrically connected to the source electrode.

6. The method for manufacturing a semiconductor device according to claim 1, further comprising:
   forming solder bumps on the source electrode and the drain electrode;
   placing the front face of the semiconductor substrate opposite a circuit board; and
   bonding the source electrode and the drain electrode to electrodes of the circuit board through the solder bumps.

7. The method for manufacturing a semiconductor device according to claim 1, wherein the front-side and back-side gate electrodes form Schottky junctions with the semiconductor substrate.

* * * * *